US008738838B2

(12) United States Patent
Cho et al.

(10) Patent No.: US 8,738,838 B2
(45) Date of Patent: May 27, 2014

(54) METHOD, DEVICE AND SYSTEM FOR STORING DATA IN STORAGE MEDIA USING A REFERENCE CONDITION

(75) Inventors: Kyoung Lae Cho, Yongin-si (KR); Chanho Yoon, Seoul (KR); JunJin Kong, Yongin-si (KR); Hee Chang Cho, Seoul (KR); Bumseok Yu, Suwon-si (KR); Hong Rak Son, Anyang-si (KR)

(73) Assignee: Samsung Electronics Co., Ltd. (KR)

( * ) Notice: Subject to any disclaimer, the term of this patent is extended or adjusted under 35 U.S.C. 154(b) by 376 days.

(21) Appl. No.: 13/082,190

(22) Filed: Apr. 7, 2011

(65) Prior Publication Data

US 2011/0252183 A1  Oct. 13, 2011

(30) Foreign Application Priority Data

Apr. 9, 2010 (KR) ........................ 10-2010-0032805

(51) Int. Cl.
*G06F 12/00* (2006.01)
*G06F 13/00* (2006.01)
*G06F 13/28* (2006.01)

(52) U.S. Cl.
USPC .............................. 711/102; 710/68; 709/247

(58) Field of Classification Search
CPC . H03M 7/30; G11C 16/349; G11C 2207/102; G06F 2212/401
USPC .............................. 711/102; 710/68; 709/247
See application file for complete search history.

(56) References Cited

U.S. PATENT DOCUMENTS

| | | |
|---|---|---|
| 5,761,536 A | 6/1998 | Franaszek |
| 5,813,011 A | 9/1998 | Yoshida et al. |
| 5,813,017 A | 9/1998 | Morris |
| 6,092,071 A | 7/2000 | Bolan et al. |
| 6,115,787 A | 9/2000 | Obara |
| 6,349,375 B1 | 2/2002 | Faulkner et al. |
| 6,532,121 B1 | 3/2003 | Rust et al. |
| 6,584,520 B1 | 6/2003 | Cowart et al. |
| 6,657,562 B2 | 12/2003 | Radermacher et al. |
| 6,678,828 B1 | 1/2004 | Pham et al. |
| 6,763,031 B1 * | 7/2004 | Gibson et al. ................. 370/428 |
| 7,596,657 B2 | 9/2009 | Kaler |
| 2004/0030813 A1 | 2/2004 | Benveniste et al. |
| 2005/0021657 A1 | 1/2005 | Negishi et al. |
| 2006/0136365 A1 | 6/2006 | Kedem et al. |
| 2008/0228998 A1 | 9/2008 | Colecchia et al. |
| 2009/0070356 A1 * | 3/2009 | Mimatsu ....................... 707/101 |
| 2010/0332700 A1 * | 12/2010 | Fallon ............................ 710/68 |

FOREIGN PATENT DOCUMENTS

JP        2007-094639         4/2007

* cited by examiner

*Primary Examiner* — Matthew Bradley
*Assistant Examiner* — Rocio Del Mar Perez-Velez
(74) *Attorney, Agent, or Firm* — Myers Bigel Sibley & Sajovec, P.A.

(57) ABSTRACT

A method of storing data in a storage media can include determining whether a size of data to be stored in the storage media satisfies a reference condition and compressing the data to provide compressed data for storage in the storage media upon determining that the size satisfies a reference condition.

17 Claims, 16 Drawing Sheets

METHOD, DEVICE AND SYSTEM FOR STORING DATA IN STORAGE MEDIA USING A REFERENCE CONDITION

CROSS-REFERENCE TO RELATED APPLICATIONS

This application claims the benefits, under 35 U.S.C §119, of Korean Patent Application No. 10-2010-0032805 filed Apr. 9, 2010, the entirety of which is incorporated by reference herein.

BACKGROUND

1. Field of the Invention

The present invention relates to the field of electronics, and more particularly, to data storage devices.

2. Description of the Related Art

Computer systems generally use so called main memory comprised of semiconductor devices typically having the attribute that the devices can be randomly written to and read from with comparable and very fast access times (i.e., hundreds of nanoseconds) and thus are commonly referred to as random access memories. However, since semiconductor memories are relatively expensive, other higher density and lower cost memories (such as magnetic disk systems) may be used. Magnetic disk storage systems generally have access times that are on the order of tens of milliseconds. Disk storage may be used to store large quantities of data which can be sequentially transferred to main memory as needed. Another type of disk like storage is solid state disk storage (SSD, also called a solid state drive). SSD is a data storage device that uses memory chips, such as SDRAM, to store data, instead of the spinning platters found in conventional hard disk drives.

The term "SSD" can be used to refer to two different kinds of products. The first type of SSD, based on fast, volatile memory such as SDRAM, is categorized by fast data access and is used primarily to accelerate applications that may be held back by the latency of disk drives. Since this type of SSD uses volatile memory, it typically incorporates internal battery and backup disk systems to ensure data persistence. If power is lost for whatever reason, the battery can keep the unit powered long enough to copy all data from RAM to backup disk. Upon the restoration of power, data is copied from the backup disk to RAM and the SSD may resume normal operation. The first type of SSD can be especially useful on a computer which already may have the maximum amount of RAM. A second type of SSD can use flash memory to store data and is generally used as a replacement for a hard disk drive.

SUMMARY

Embodiments according to the inventive concept can provide methods of storing data in storage media, data storage devices and systems using the same. Pursuant to these embodiments, methods of storing data in a storage media can be provided by determining whether a size of data to be stored in the storage media satisfies a reference condition and compressing the data to provide compressed data for storage in the storage media upon determining that the size satisfies a reference condition.

In some embodiments according to the inventive concept, compressing the data can provide the compressed data upon determining that a non-zero remainder is generated upon dividing the size of the data by a physical storage unit wherein the remainder is less than a reference size. In some embodiments according to the inventive concept, the reference size can be less than 50% of the physical storage unit.

In some embodiments according to the inventive concept, the storage media can be a non-volatile memory, and the physical storage unit can be a sector, a page, a block, a super-block, or a plurality of blocks of the non-volatile memory.

In some embodiments according to the inventive concept, the method can further include storing the data uncompressed in the storage media when the size of the data is determined not to satisfy the reference condition. In some embodiments according to the inventive concept, compressing the data to be stored can be provided by compressing all the data to be stored in the storage media or only compressing the data to be stored in a last block among data to be stored in the storage media.

In some embodiments according to the inventive concept, the method can further include determining whether the data to be stored in the storage media is compressed data and storing the compressed data in the storage media without further compression. In some embodiments according to the inventive concept, determining whether the data to be stored in the storage media is compressed data can be provided by determining whether the data to be stored in the storage media is compressed data prior to determining whether the size of data to be stored in the storage media satisfies the reference condition. In some embodiments according to the inventive concept, the method can further include comparing a time needed to compress the data to a time needed to perform write and read operations to determine whether the time taken to compress data is greater than a predetermined ratio, wherein data is stored in the storage media without a data compression when the time taken to compress data is greater than the predetermined ratio.

In some embodiments according to the inventive concept, a data storage device can include a storage media and a controller that is configured to selectively compress data for storage in the storage media based on whether a size of the data to be stored in the storage media satisfies a reference condition.

In some embodiments according to the inventive concept, a system can include a plurality of solid state drives, wherein each of the plurality of solid state drives can include a storage media and a controller that is configured to selectively compress data for storage in the storage media based on whether a size of the data to be stored in the storage media satisfies a reference condition.

DESCRIPTION OF EMBODIMENTS ACCORDING TO THE INVENTIVE CONCEPT

Figure 1:
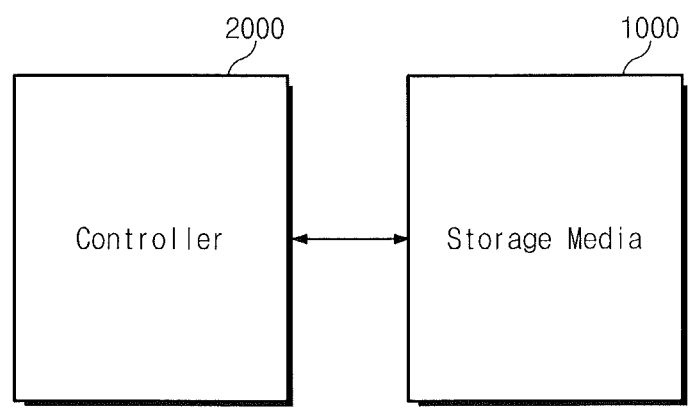
FIG. 1 is a block diagram showing a data storage device according to an exemplary embodiment of the inventive concept.

The inventive concept is described more fully hereinafter with reference to the accompanying drawings, in which embodiments of the inventive concept are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. Like numbers refer to like elements throughout.

It will be understood that, although the terms first, second, third etc. may be used herein to describe various elements which should not be limited by these terms. These terms are only used to distinguish one element from another. Thus, a first element discussed below could be termed a second element without departing from the teachings of the inventive concept.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

As used herein, the term "compression" in association with some blocks shown in the figures includes the functions of both compression and decompression (or compression/decompression or the like). Accordingly, when a block is labeled as "compression" it will be understood that the block may also perform decompression as well as compression.

FIG. 1 is a block diagram showing a data storage device according to an exemplary embodiment of the inventive concept.

Referring to FIG. 1, a data storage system includes a storage media 1000 and a controller 2000. The storage media 1000 is used to store data information of various types such as text, graphics, software and the like. The storage media 1000, for example, includes a non-volatile memory such as PRAM, FeRAM, MRAM, or the like. But, the non-volatile memories applied to the storage media 1000 are not limited to these. The controller 2000 is configured to control the storage media 1000 in response to external requests. The controller 2000 is configured to compress data from an external device and to store the compressed data in the storage media 1000. The data compression manner enables the storage media 1000 to store more data, possibly at reduced cost. Further, with the data compression, it may be possible to reduce the amount of data transferred between the storage media 1000 and the controller 2000. That is, with the data compression, the time taken to transfer data between the storage media 1000 and the controller 2000 may be reduced.

In an exemplary embodiment of the inventive concept, the controller 2000 is configured to selectively compress data to be stored in the storage media 1000. For example, the controller 2000 selectively performs data compression according to a size of data to be stored.

Figure 2:
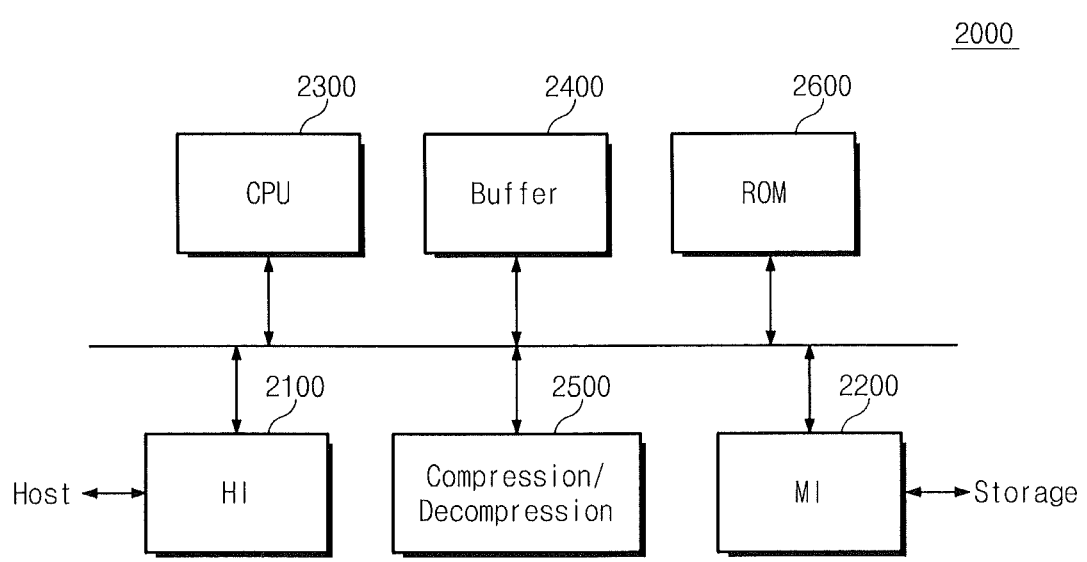
FIG. 2 is a block diagram showing a controller illustrated in FIG. 1 according to an exemplary embodiment of the inventive concept.

FIG. 2 is a block diagram showing a controller illustrated in FIG. 1 according to an exemplary embodiment of the inventive concept.

Referring to FIG. 2, a controller 2000 comprises a first interface 2100, a second interface 2200, CPU 2300 being a processing unit, a buffer 2400, a compression/decompression block 2500, and ROM 2600.

The first interface 2100 is configured to interface with an external device (or, a host). The second interface 2200 is configured to interface with storage media 1000 illustrated in FIG. 1. The CPU 2300 is configured to control an overall operation of the controller 2000. For example, the CPU 2300 is configured to execute firmware such as a memory translation layer (MTL) code stored in the ROM 2600. The MTL is used to manage memory mapping information and whether or not data is compressed. But, a role of the MTL is not limited to this. For example, the MTL may be used to manage wear-leveling, bad blocks, data retention caused due to unexpected power interruption, and the like.

The buffer 2400 is used to temporarily buffer data received from an external device over the first interface 2100. The compression/decompression block 2500 operates responsive to the control of the CPU 2300 (or, the control of MTL executed by the CPU 2300) and is configured to compress data in the buffer 2400. Compressed data is stored in the storage media 1000 via the second interface 2200. Further, the compression/decompression block 2500 operates responsive to the control of the CPU 2300 (or, the control of MTL executed by the CPU 2300) and is configured to decompress data read out from the storage media 1000.

Figure 3:
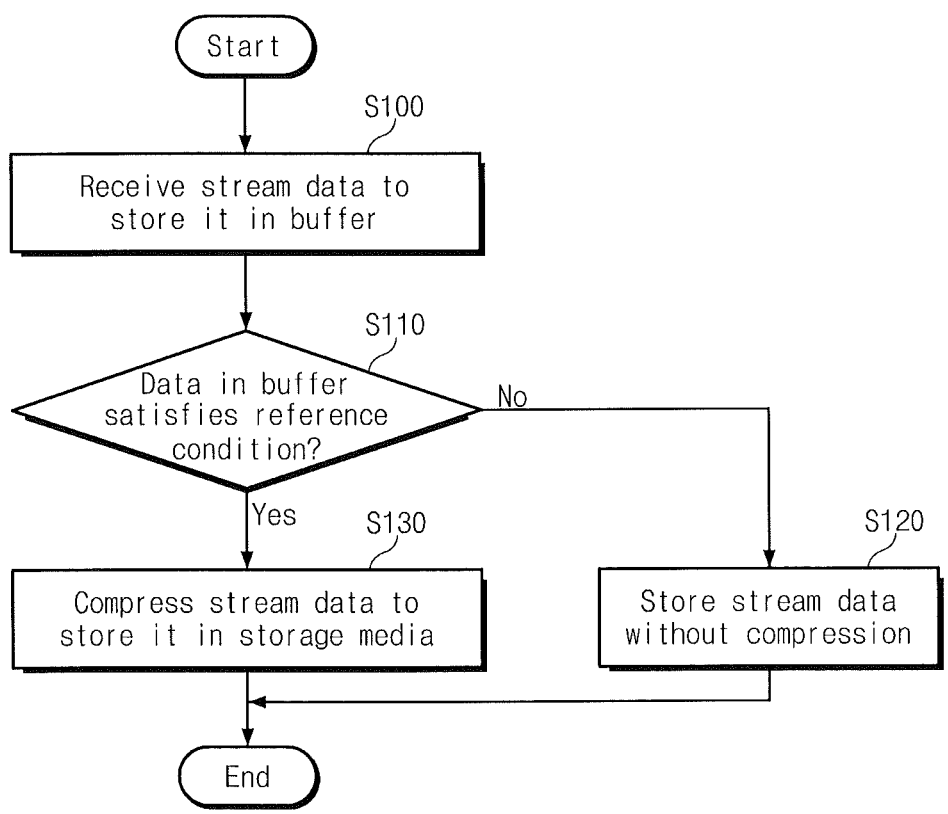
FIG. 3 is a flow chart for describing a write operation of a data storage device according to an exemplary embodiment of the inventive concept.

FIG. 3 is a flow chart for describing a write operation of a data storage device according to an exemplary embodiment of the inventive concept. In step S100, stream data, externally provided upon write request, is stored in the buffer 2400 under the control of CPU 2300. In step S110, the CPU 2300 or a memory translation layer MTL operated by the CPU 2300 judges (i.e., determines) whether the size of data stored in the buffer 2400 satisfies a reference condition. If the size of data stored in the buffer 2400 does not satisfy the reference condition, the procedure goes to step S120, in which data stored in the buffer 2400 is stored in the storage media 1000 via the second interface 2200 without being compressed. If the size of data stored in the buffer 2400 does satisfy the reference condition, the procedure goes to step S130, in which data stored in the buffer 2400 is compressed by a compression/decompression block 2500 and the compressed data is stored in the storage media 1000 via the second interface 2200.

In some embodiments according to the inventive concept, the reference condition can be determined variously. For example, the reference condition may be determined according to a physical storage unit LWU of the storage media 1000. Herein, the physical storage unit LWU may have a size of a physical block of the storage media 1000. In some embodiments according to the inventive concept, the physical storage unit LWU is set to have a size corresponding to a size of a super-block of the storage media 1000, a size corresponding to a sum of plural blocks thereof, and the like. If there is no residue when a size of data is divided by the physical storage unit LWU, data in the buffer 2400 may be stored in the storage media 1000 without compression. If a non-zero residue is generated when a size of data is divided by the physical storage unit LWU and the residue exceeds a predetermined size, data in the buffer 2400 may be stored in the storage media 1000 without compression. On the other hand, if a non-zero residue is generated when the size of data is divided by the physical storage unit LWU and the residue is less than a predetermined size (for example, less than 50% of the physical storage unit LWU), data in the buffer 2400 is compressed by the compression/decompression block 2500, and the compressed data is stored in the storage media 1000 via the second interface 2200. Compression of data in the buffer 2400 may be made with respect to all data therein or data to be stored in a last block among data in the buffer 2400.

The term residue can also be referred to as a remainder defined by an amount which remains after dividing the size of the data by the physical storage unit LWU. For example, if the physical storage unit LWU is 2048 bytes and the data size is 1536 bytes, the remainder can be defined as 512 bytes, or about 25% the physical storage unit LWU.

In some embodiments according to the inventive concept, a physical storage unit LWU of the storage media 1000 may be set to a block, a super-block, or the like according to a non-volatile memory applied to the storage media 1000. In the event that a non-volatile memory has an M-plane array structure (M being 2 or more integer), the super-block is formed of N memory blocks in each of M planes and in the same row. N may be an integer less than M. Further, the physical storage unit may be formed of a plurality of blocks in the same plane.

In some embodiments according to the inventive concept, the greater the physical storage unit LWU, the more the compression ratio of raw data to compressed data.

Figure 4:
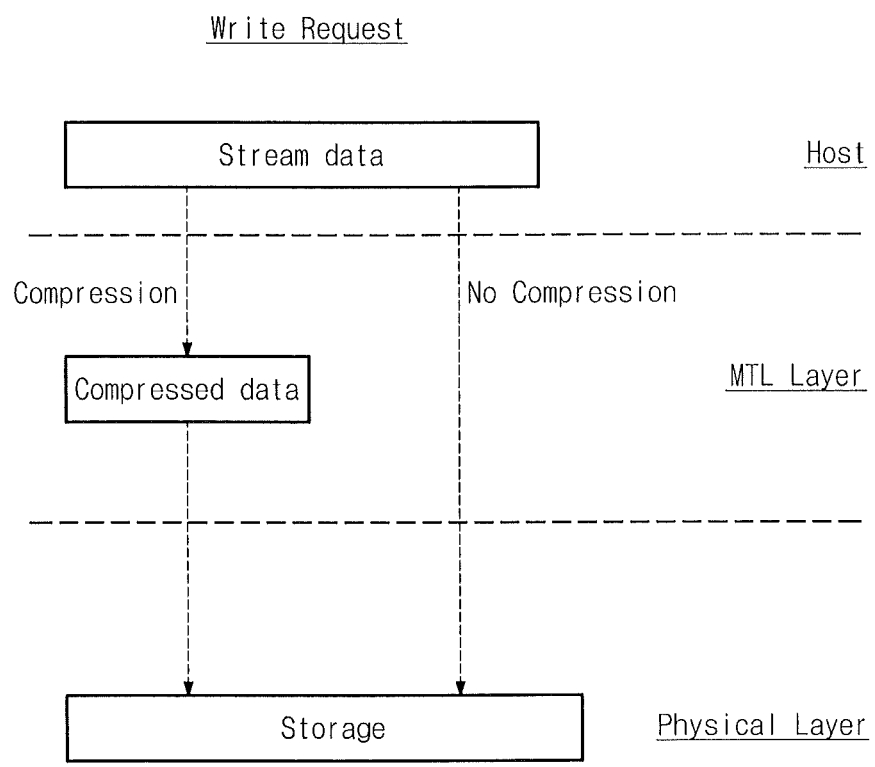
FIG. 4 is a diagram showing an overall write flow of a data storage device according to an exemplary embodiment of the inventive concept.

FIG. 4 is a diagram showing an overall write flow of a data storage device according to an exemplary embodiment of the inventive concept.

Referring to FIG. 4, a memory translation layer MTL judges whether or not compress write-requested data according to a manner described in FIG. 3, and a compression/decompression block 2500 selectively compresses the write-requested data according to the result. The compressed data is stored in the storage media 1000. A size of the compressed data may satisfy the condition that the residue (or remainder) is generated by dividing the size of data by the physical storage unit LWU and the residue does not exceed a predetermined size (for example, less than 50% of the physical storage unit LWU).

In some embodiments according to the inventive concept, some of the functions (for example, a function of determining whether or not compression is to be applied) of the MTL may be controlled at a host level. In this case, information indicating whether or not of compression is provided to a data storage device together with stream data, and the data storage device performs a compression function according to the externally provided information. Alternatively, it is possible to transfer data to the data storage device based on a division size (or, a compression size) determined at a host level.

In some embodiments according to the inventive concept, a physical storage unit LWU is formed of a writable unit WU or a plurality of writable units. For example, the physical storage unit LWU may be set to a block, a super-block, M blocks (M being 2 or more integer), or M super-blocks. The writable unit WU indicates a unit by which memory cells are programmed at the same time. The writable unit WU, for example, includes a word, a page, a plurality of sectors, etc.

Figure 5:
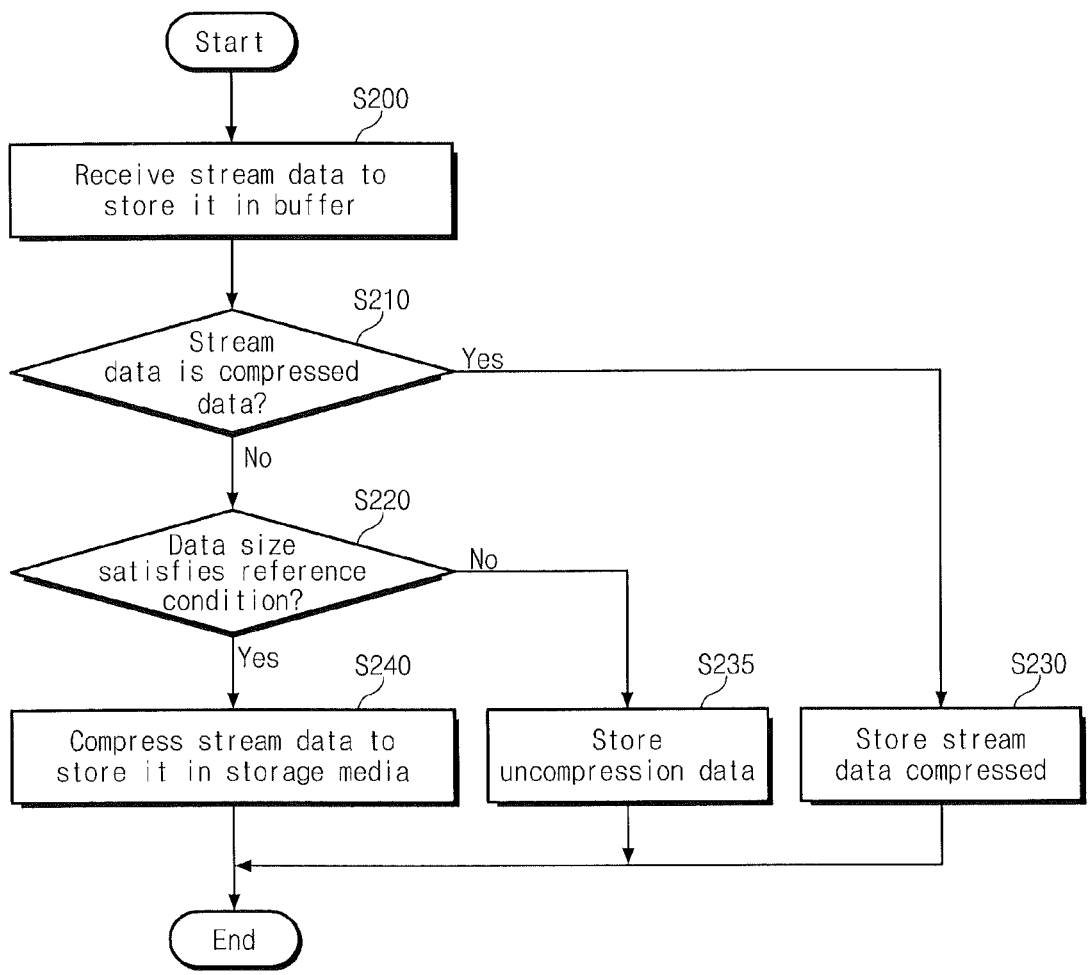
FIG. 5 is a flow chart for describing a write operation of a data storage device according to another exemplary embodiment of the inventive concept.

FIG. 5 is a flow chart for describing a write operation of a data storage device according to another exemplary embodiment of the inventive concept.

In step S200, stream data externally provided upon write request is stored in a buffer 2400 via a first interface 2100 under the control of CPU 2300. In step S210, CPU 2300 or a memory translation layer MTL operated by the CPU 2300 judges whether received stream data is compressed data. In some embodiments according to the inventive concept, whether received stream data is compressed data may be judged according to a file extension of stream data or header information included in stream data. The criteria of judging compressed data are not limited.

If received data is not compressed, the procedure goes to step S220. If received data is compressed, the procedure goes to step S230 whereupon the compressed data is stored. In step S220, the CPU 2300 (or the memory translation layer MTL operated by the CPU 2300) judges whether a size of data in a buffer 2400 satisfies a reference condition. If a size of data in a buffer 2400 is judged not to satisfy a reference condition, the procedure goes to step S235, in which data stored in the buffer 2400 is stored in the storage media 1000 via the second interface 2200 without compression. On the other hand, if a size of data in a buffer 2400 is judged to satisfy a reference condition, the procedure goes to step S240, in which data stored in the buffer 2400 is compressed by a compression/decompression block 2500 and the compressed data is stored in the storage media 1000 via the second interface 2200. The reference condition used in step S220 can be substantially identical to that described in FIG. 3.

In some embodiments according to the inventive concept, the judgment in step S210, can be based on whether the time needed to compress data is more than a predetermined ratio for write or read operations. When the time needed to compress data is more than a predetermined ratio for writes or reads, the data may be stored in the storage media 1000 without compression.

In some embodiments according to the inventive concept, the controller 2000 can be configured to adjust a compression unit of data. The compression unit can be adjusted such that a size of compressed data fits into a physical storage unit of the storage media 1000. Herein, the physical storage unit LWU can be set to a size corresponding to a block, a plurality of blocks, a super-block, and the like.

Figure 6:
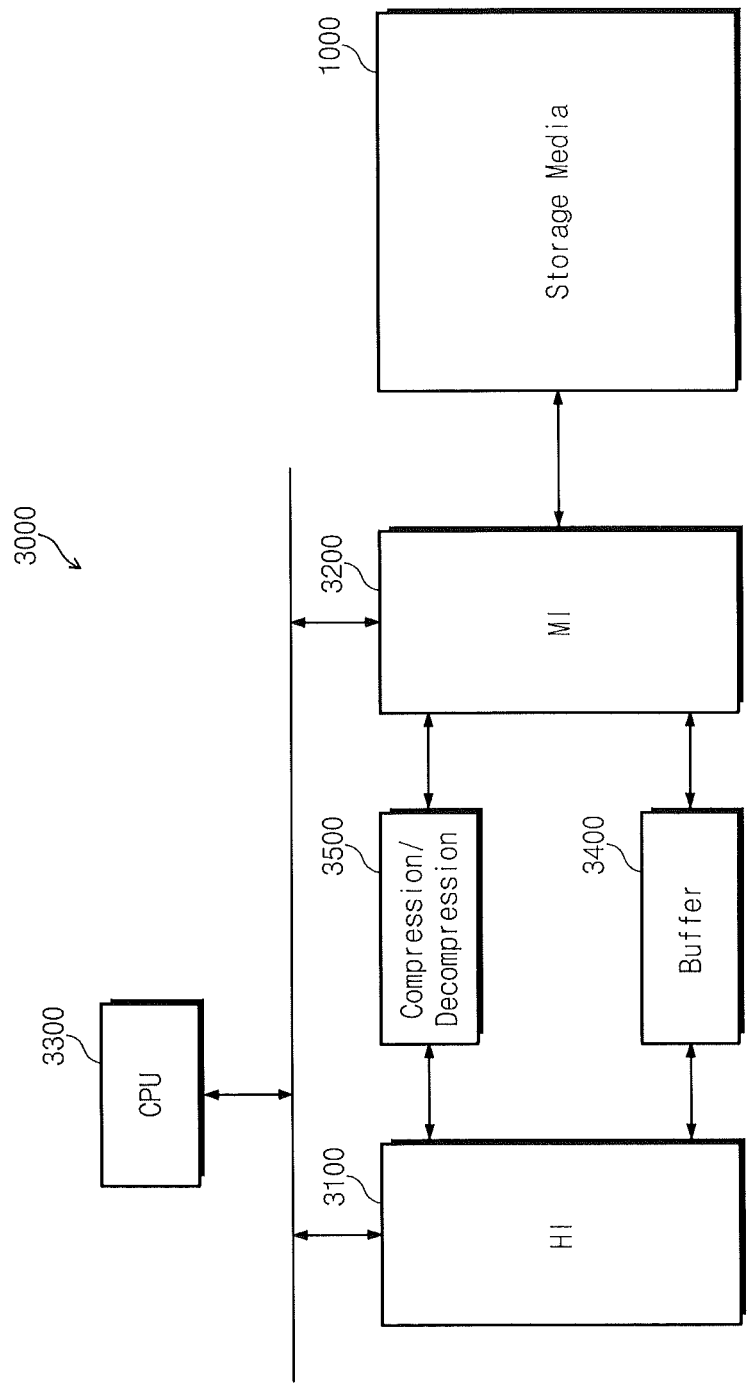
FIG. 6 is a block diagram showing a data storage device according to another exemplary embodiment of the inventive concept.

FIG. 6 is a block diagram showing a data storage device according to another exemplary embodiment of the inventive concept.

Referring to FIG. 6, a data storage device comprises a storage media 1000 and a controller 3000. The storage media 1000 is configured substantially identically to that illustrated in FIG. 1. The controller 3000 comprises first and second interfaces 3100 and 3200, CPU 3300, a buffer 3400, and a compression/decompression block 3500. The first and second interfaces 3100 and 3200 are identical to that in FIG. 2. The buffer 3400 is used to transfer data between the first and second interfaces 3100 and 3200 under the control of the CPU 3300. The compression/decompression block 3500 is configured to compress data transferred via the first interface 3100 under the control of the CPU 3300 (or, MTL operated by the CPU 3300). In this case, the compression/decompression block 3500 may include a buffer for storing data. A unit compressed by the compression/decompression block 3500, that is, a division/compression unit of stream data can be controlled as described above.

In some embodiments according to the inventive concept, a data storage device is configured such that the compression/decompression block 3500 is turned ON/OFF as needed. For example, the compression/decompression block 3500 can be turned ON/OFF according to the received stream data. If compressed multimedia data is provided to a data storage device, or if the energy consumption for the data compression is high due to the small size of data, the compression/decompression block 3500 may go to the OFF state. When the compression/decompression block 3500 is disabled, data is transferred to a storage media 1000 via the buffer 3400. Alternatively, externally provided data may be stored directly in the storage media 1000 via the first and second interfaces 3100 and 3200. The ON/OFF state of the compression/decompression block 3500 may be controlled by hardware (for example, a register) or software. Stream data provided via the first interface 3100 can be stored in both the buffer 3400 and a buffer of the compression/decompression block 3500. Either one of data in the buffer 3400 and data compressed by the compression/decompression block 3500 is stored in the storage media 1000 according to whether a compression function is activated or inactivated.

Figure 7:
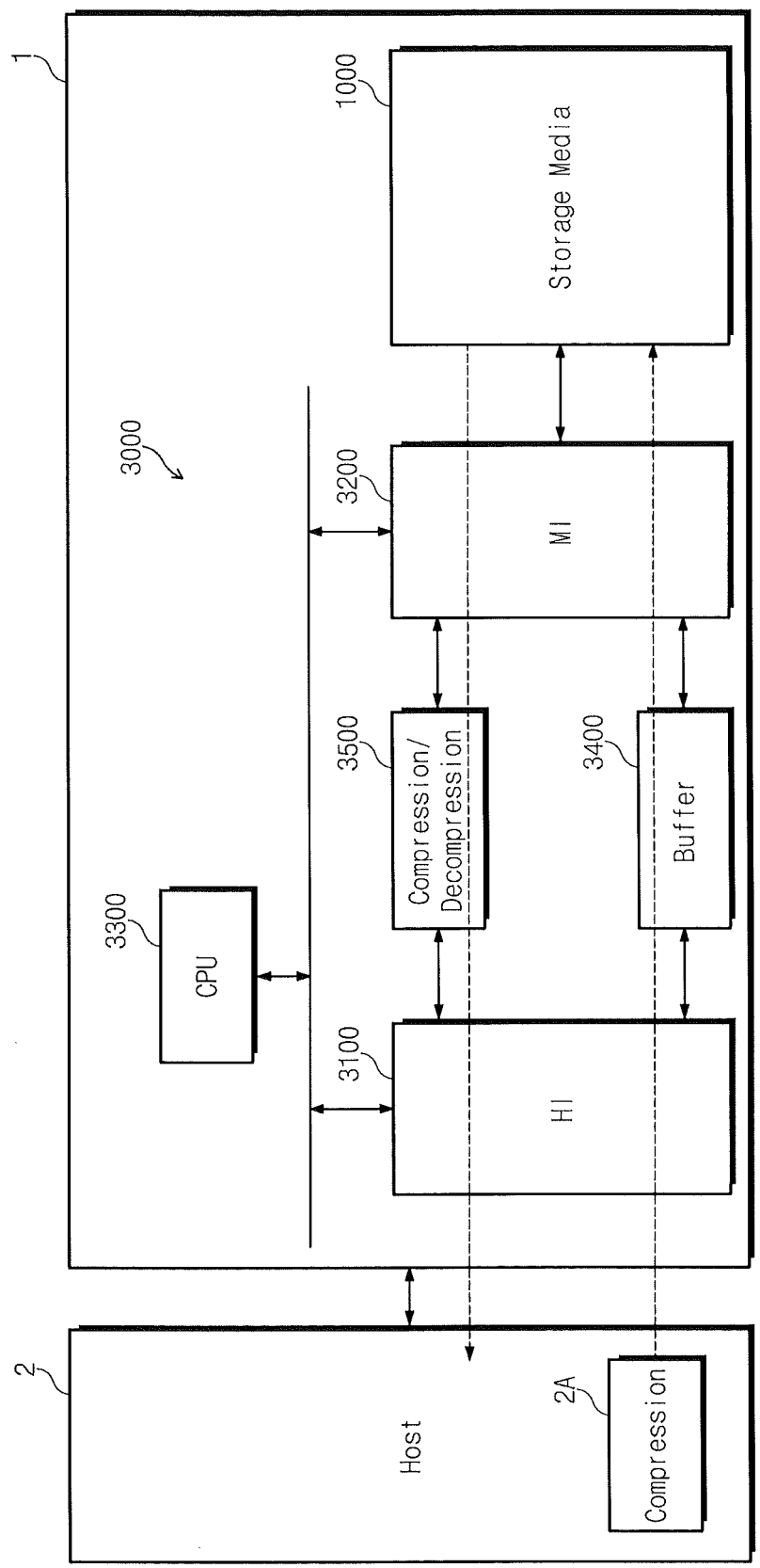
FIGS. 7 and 8 are block diagrams showing systems to which a data storage device according to an exemplary embodiment of the inventive concept is applied.
Figure 8:
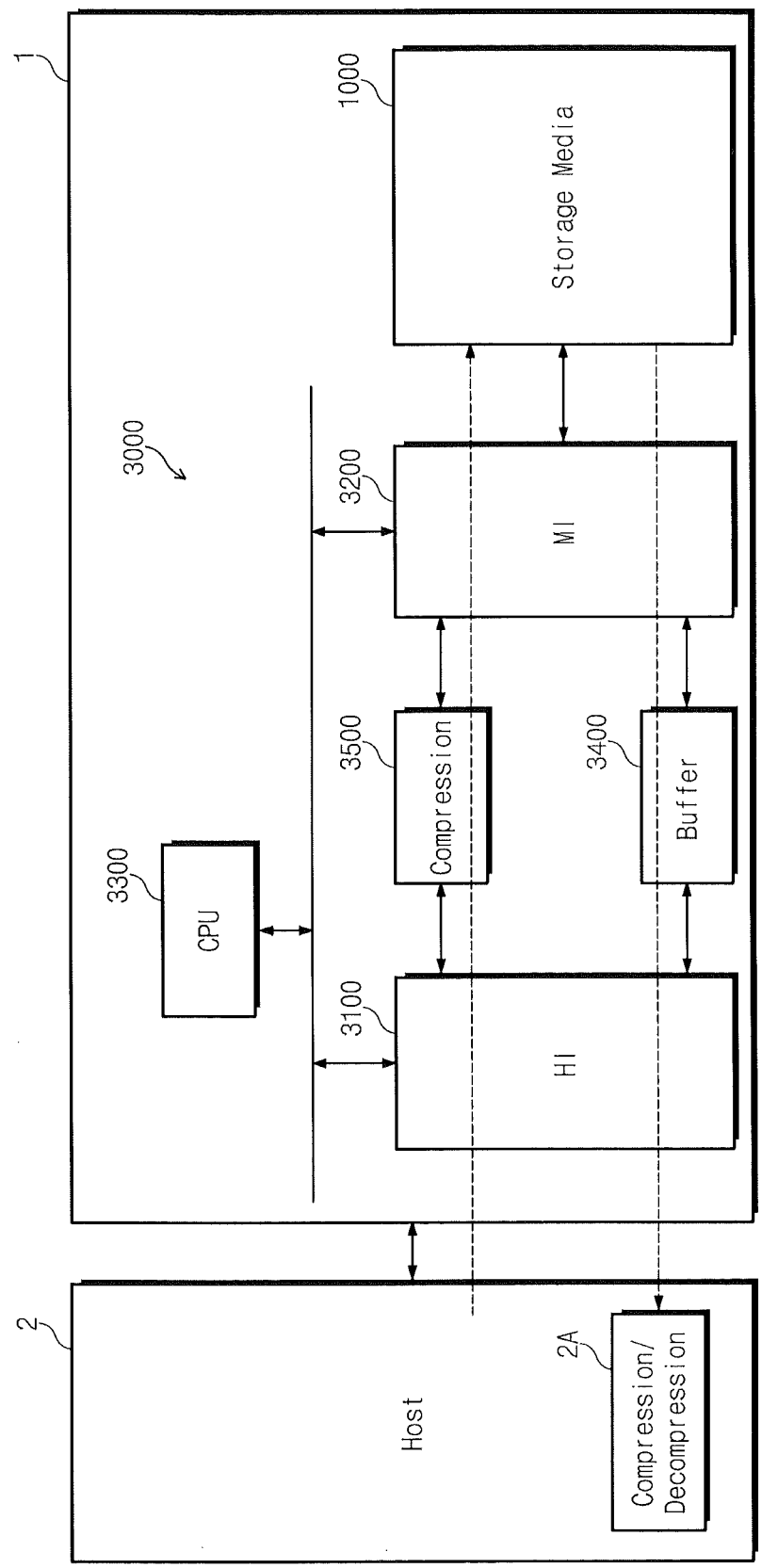

FIGS. 7 and 8 are block diagrams showing systems to which a data storage device according to an exemplary embodiment of the inventive concept is applied.

Referring to FIG. 7, a system comprises a data storage device 1 and a host 2. The host 2 comprises a compression/decompression block 2A which is configured to compress data to be transferred to the data storage device 1. The data storage device 1 is configured the same as illustrated in FIG. 6. The controller 2000 in FIG. 2 can be used as a controller of the data storage device 1 in FIG. 7.

The host 1 sends data compressed by the compression/decompression block 2A to the data storage device 1, and the transferred data is stored in the storage media 1000 via the buffer 3400. In the event that data is transferred to the host 2 from the data storage device 1, compressed data read out from the storage media 1000 is decompressed by the compression/decompression block 3500 of the data storage device 1, and the decompressed data is sent to the host 2. The same compression algorithms are applied to the compression/decompression blocks 2A and 3500.

On the other hand, as illustrated in FIG. 8, a host 1 sends raw data to a data storage device, and the raw data is compressed by a compression/decompression block 3500 and compressed data is stored in a storage media 1000. In the event that data is transferred to the host 2 from the data storage device 1, data read out from the storage media 1000 is sent to the host 1 via the buffer 3400, and a compression/decompression block 2A of the host 1 decompresses the data transferred from the data storage device 1.

Figure 9:
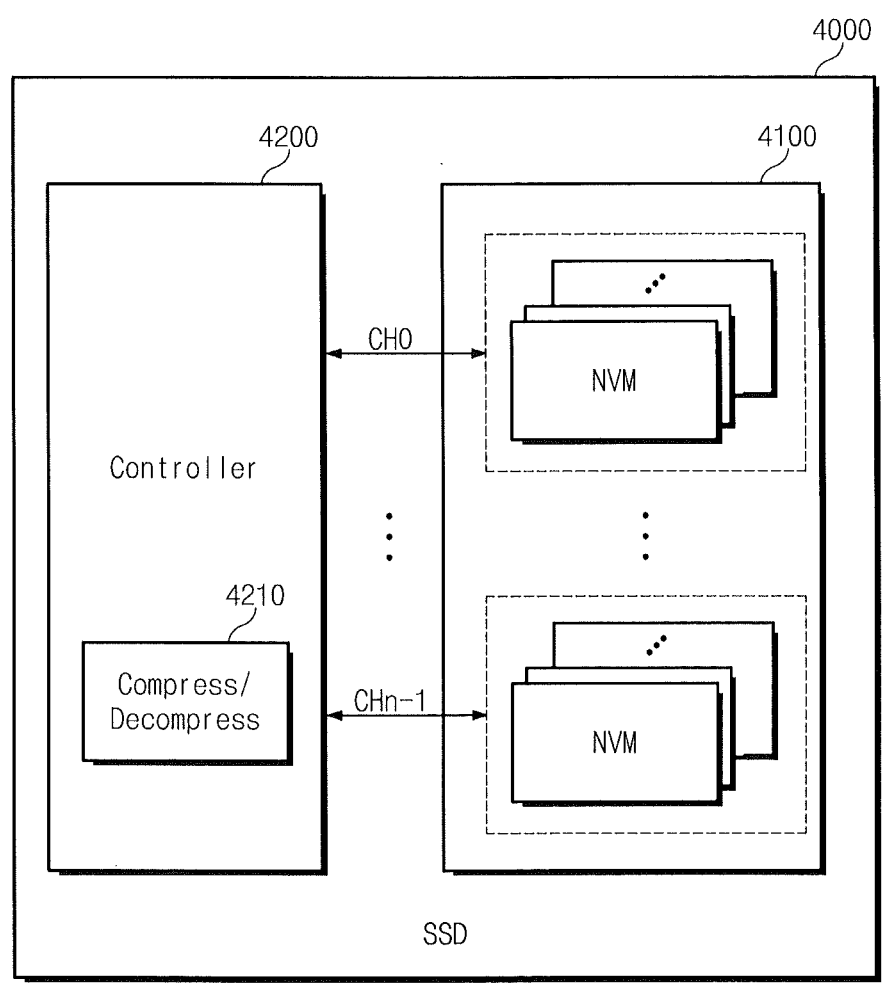
FIG. 9 is a block diagram showing a solid state drive (SSD) to which compression according to exemplary embodiments of the inventive concept is applied.

FIG. 9 is a block diagram showing a solid state drive (SSD) to which compression according to exemplary embodiments of the inventive concept is applied.

Referring to FIG. 9, a solid state drive (SSD) 4000 comprises a storage media 4100 and a controller 4200. The storage media 4100 is connected with the controller 4200 via a plurality of channels, each of which is commonly connected with a plurality of non-volatile memories. The controller 4200 includes a compression/decompression block 4210 which is configured to compress and decompress data.

Figure 10:
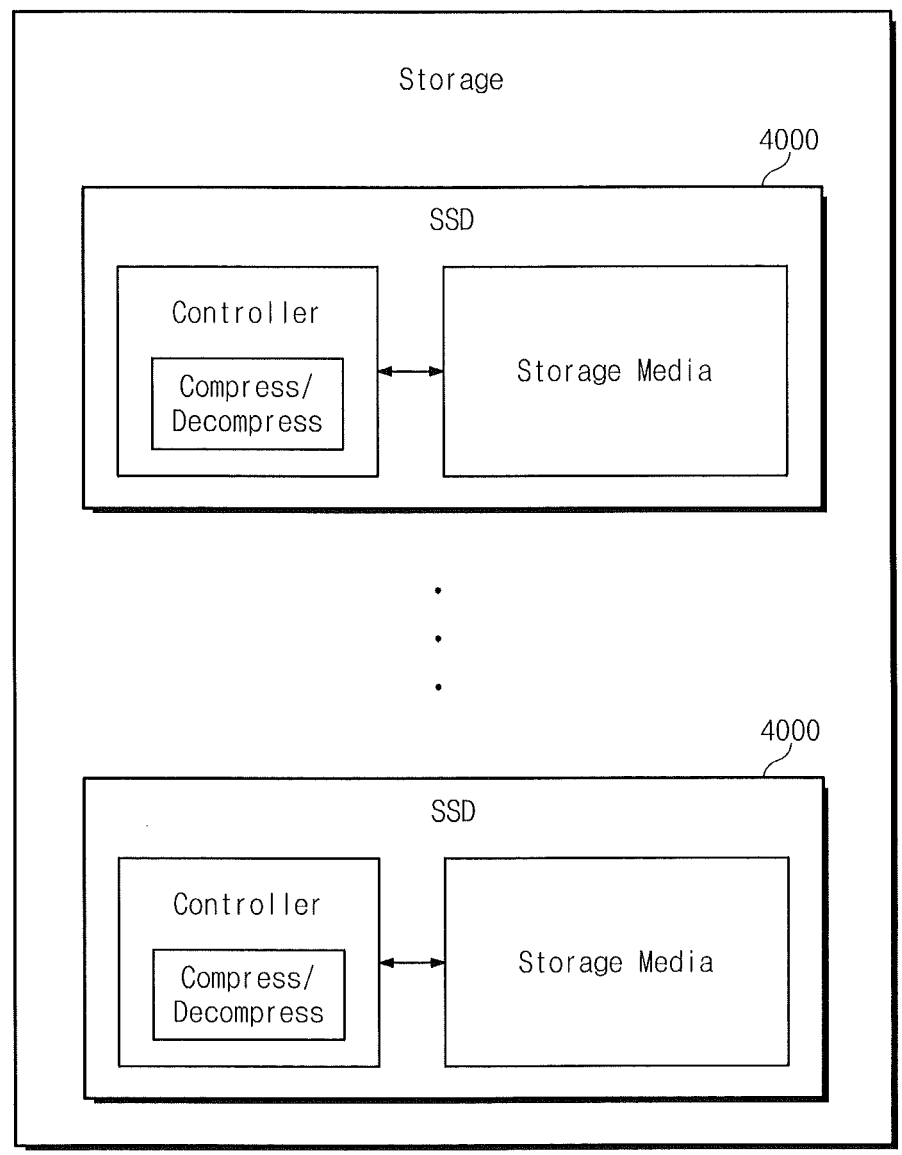
FIG. 10 is a block diagram showing a storage device using an SSD illustrated in FIG. 9.
Figure 11:
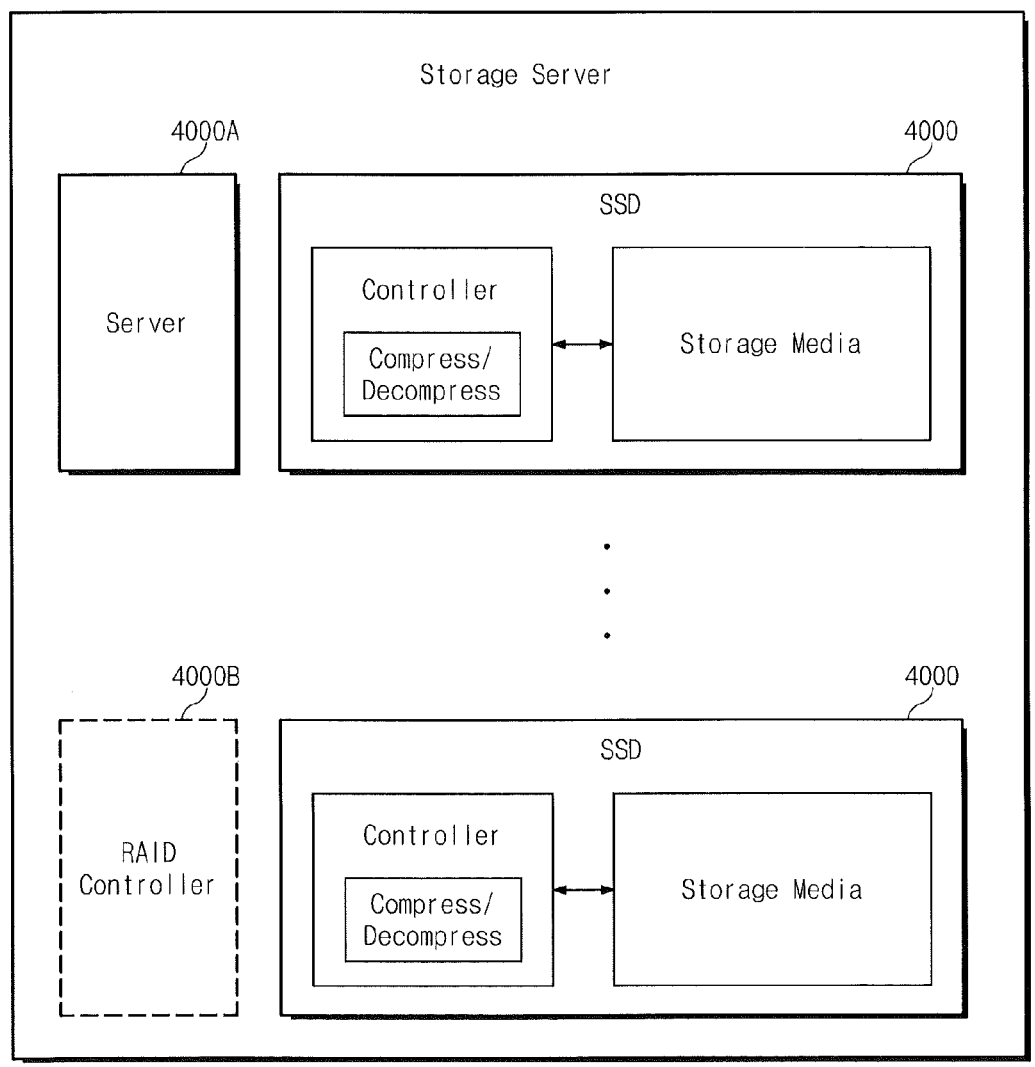
FIG. 11 is a block diagram showing a storage server using an SSD illustrated in FIG. 15.
Figure 15:
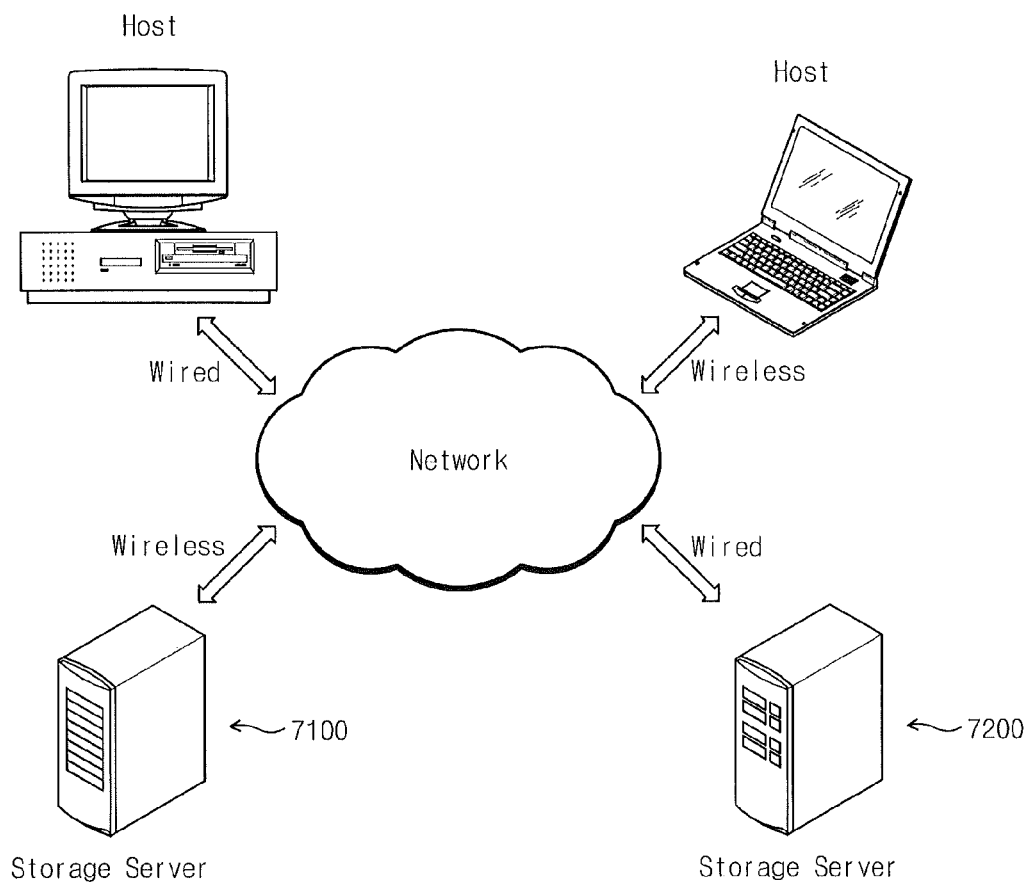

FIG. 10 is a block diagram showing a storage using an SSD illustrated in FIG. 9, and FIG. 11 is a block diagram showing a storage server using an SSD illustrated in FIG. 15.

An SSD 4000 according to an exemplary embodiment of the inventive concept is used as a storage system. As illustrated in FIG. 10, a storage system includes a plurality of solid state drives 4000 which are configured the same as described in FIG. 9. An SSD 4000 according to an exemplary embodiment of the inventive concept is configured as a storage sever. As illustrated in FIG. 11, a storage server includes a plurality of solid state drives 4000, which are configured the same as described in FIG. 9, and a server 4000A. Further, a RAID controller 4000B is provided in the storage server.

Figure 12:
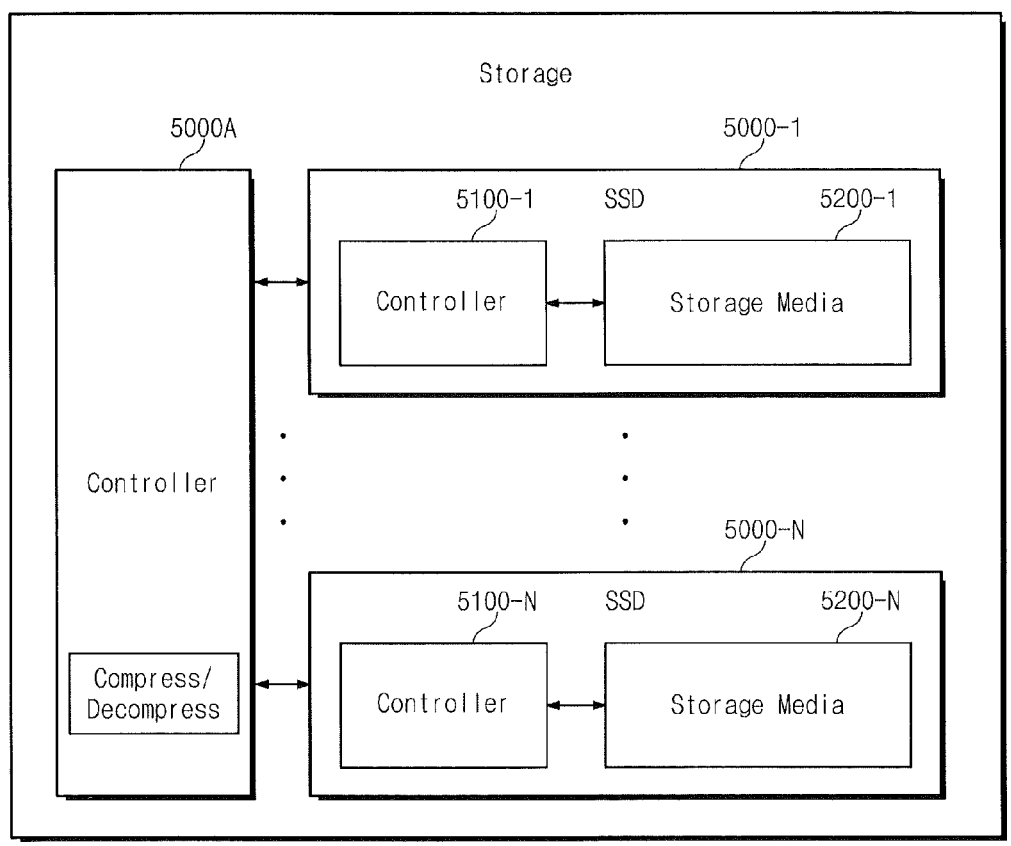
FIG. 12 is a block diagram showing a storage device according to another exemplary embodiment of the inventive concept.
Figure 13:
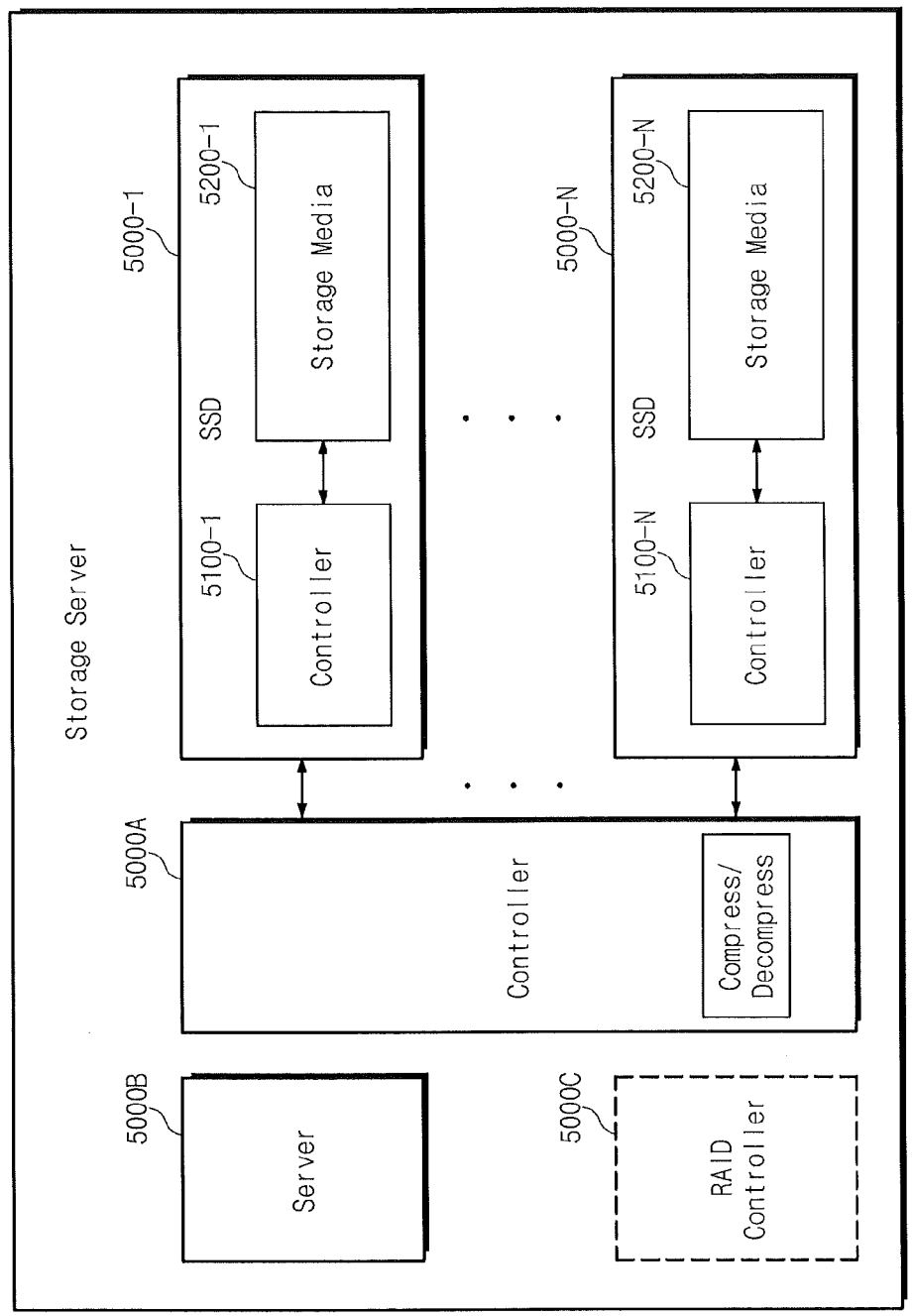
FIG. 13 is a block diagram showing a storage server using a storage device in FIG. 12.

FIG. 12 is a block diagram showing a storage system according to another exemplary embodiment of the inventive concept, and FIG. 13 is a block diagram showing a storage server using a storage system in FIG. 12.

Referring to FIG. 12, a storage system comprises a plurality of solid state drives 5000 and a control block 5000A. Each of the solid state drives 5000 1-N includes a controller 5100 1-N and a storage media 5200 1-N. The controller 5100 1-N is configured to perform an interface function with the storage media 5200. The solid state drives 5000 1-N are controlled by the control block 5000A. The control block 5000A is configured to perform the above-described functions (for example, change of a division size and compression). The storage system in FIG. 12 is used to configure a storage server. As illustrated in FIG. 13, a storage server includes a server 5000B and a storage (5000, 5000A) which is configured to be identical to that in FIG. 12. Further, a RAID controller 5000C is provided in the storage server.

Figure 14:
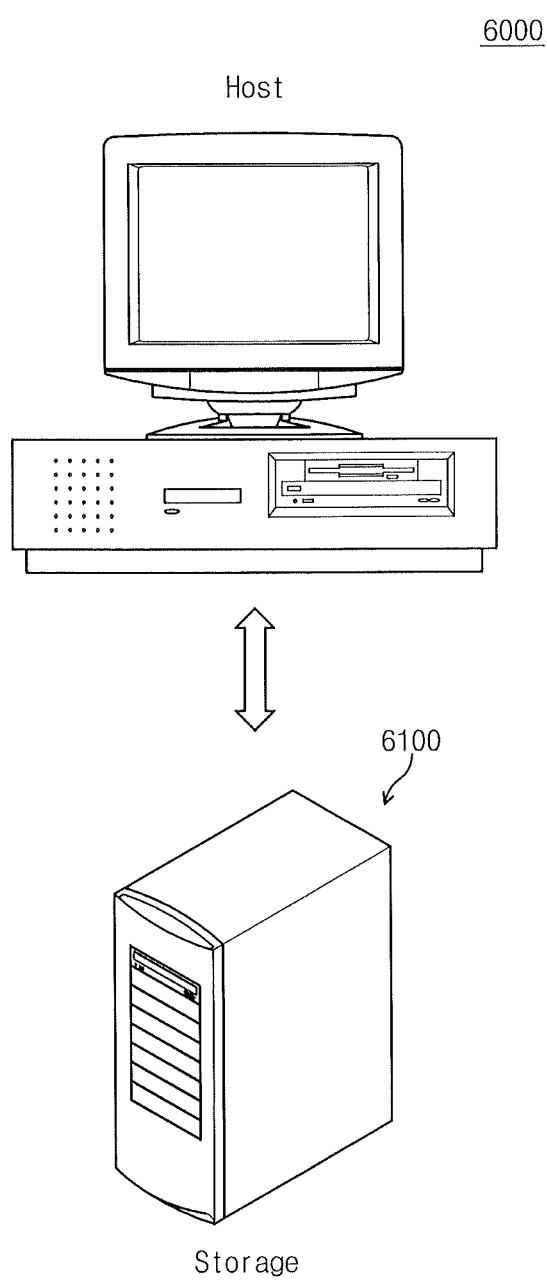
FIGS. 14 to 16 are diagrams showing systems to which a data storage device according to exemplary embodiments of the inventive concept is applied.
Figure 16:
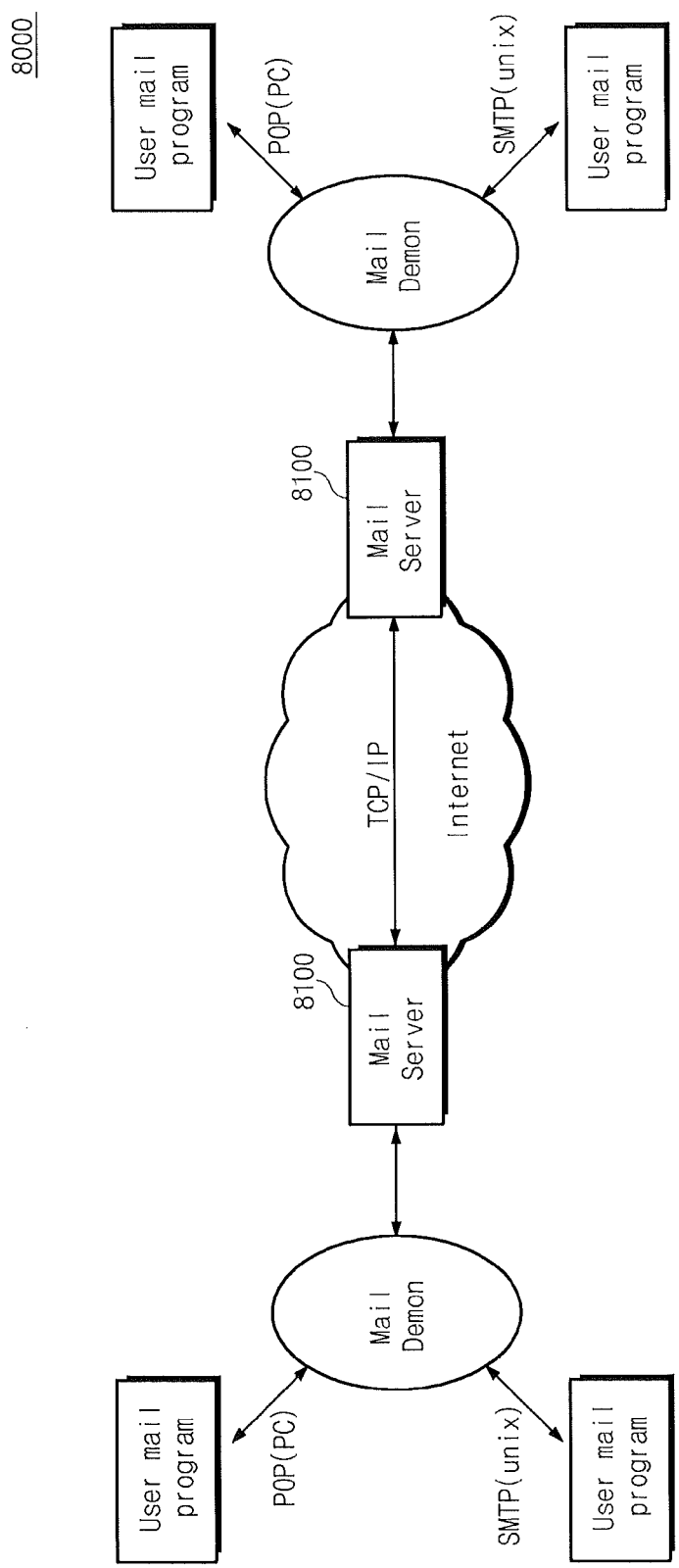

FIGS. 14 to 16 are diagrams showing systems to which a data storage device according to exemplary embodiments of the inventive concept is applied.

In the event that a solid state drive including a data storage device according to exemplary embodiments of the inventive concept is applied to a storage, as illustrated in FIG. 14, a system 6000 includes a storage 6100 which communicates with a host by a wire or wireless manner. In a case where a solid state drive including a data storage device according to exemplary embodiments of the inventive concept is applied to a storage server, as illustrated in FIG. 15, a system 7000 includes a storage servers 7100 and 7200 which communicate with a host by a wire or wireless manner. Further, as illustrated in FIG. 16, a solid state drive including a data storage device according to exemplary embodiments of the inventive concept can be applied to a mail server system 8000.

In some embodiments according to the inventive concept, a compression/decompression block 2500 of a controller 2000 may include one of the following compression algorithms or a combination of two or more compression algorithm. Compression algorithms may includes LZ77&LZ78, LZW, Entropy encoding, Huffman coding, Adpative Huffman coding, Arithmetic coding, DEFLATE, JPEG, etc.

In some embodiments according to the inventive concept, a first interface 2100 of a controller 2000 may be formed of one of computer bus standards, storage bus standards, and iFCPPeripheral bus standards, or a combination of two or more standards. The computer bus standards may includes S-100 bus, Mbus, Smbus, Q-Bus, ISA, Zorro II, Zorro III, CAMAC, FASTBUS, LPC, EISA, VME, VXI, NuBus, TURBOchannel, MCA, Sbus, VLB, PCI, PXI, HP GSC bus, CoreConnect, InfiniBand, UPA, PCI-X, AGP, PCIe, Intel QuickPath Interconnect, Hyper Transport, etc. The storage bus standards may include ST-506, ESDI, SMD, Parallel ATA, DMA, SSA, HIPPI, USB MSC, FireWire(1394), Serial ATA, eSATA, SCSI, Parallel SCSI, Serial Attached SCSI, Fibre Channel, iSCSI, SAS, RapidIO, FCIP, etc. The iFCPPeripheral bus standards may include Apple Desktop Bus, HIL, MIDI, Multibus, RS-232, DMX512-A, EIA/RS-422, IEEE-1284, UNI/O, 1-Wire, I2C, SPI, EIA/RS-485, USB, Camera Link, External PCIe, Light Peak, Multidrop Bus, etc.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A method of storing data in a storage media, comprising:
determining whether a size of data to be stored in the storage media satisfies a reference condition; and
compressing the data to provide compressed data for storage in the storage media upon determining that the size satisfies a reference condition, wherein compressing comprises compressing the data to provide the compressed data upon determining that a non-zero remainder is generated upon dividing the size of the data by a physical storage unit wherein the remainder is less than a reference size that is a portion of a size of the physical storage unit.

2. The method of claim 1, wherein the reference size comprises less than 50% of the physical storage unit.

3. The method of claim 1, wherein the storage media comprises at least one non-volatile memory, and the physical storage unit is selected from a group consisting of a sector, a page, a block, a super-block, and a plurality of blocks of the non-volatile memory.

4. The method of claim 1, further comprising:
storing the data uncompressed in the storage media when the size of the data is determined not to satisfy the reference condition.

5. The method of claim 1, wherein compressing the data comprises compressing all the data to be stored in the storage media or only compressing the data to be stored in a last block among data to be stored in the storage media.

6. The method of claim 1, further comprising:
determining whether the data to be stored in the storage media is compressed data; and
storing the compressed data in the storage media without further compression.

7. The method of claim 6, wherein determining whether the data to be stored in the storage media is compressed data comprises:
determining whether the data to be stored in the storage media is compressed data prior to determining whether the size of data to be stored in the storage media satisfies the reference condition.

8. The method of claim 1, further comprising comparing a time needed to compress the data to a time needed to perform write and read operations to determine whether the time taken to compress data is greater than a predetermined ratio, wherein data is stored in the storage media without data compression when the time taken to compress data is greater than the predetermined ratio.

9. A data storage device comprising:
a storage media;
CPU;
a controller configured to selectively compress data for storage in the storage media based on whether a size of the data to be stored in the storage media satisfies a reference condition; and
a memory translation layer operated by the CPU and configured to determine whether a non-zero remainder is generated upon dividing the size of the data by a physical storage unit and the remainder is less than a reference size that is a portion of a size of the physical storage unit.

10. The data storage device of claim 9, wherein the controller comprises:
a buffer operating responsive to the control of the CPU and configured to store the data; and
a compression/decompression block operating responsive to the control of the CPU to compress or decompress the data in the buffer.

11. The data storage device of claim 9, wherein the reference size comprises less than 50% of the physical storage unit.

12. The data storage device of claim 9, wherein the storage media comprises at least one non-volatile memory, and the physical storage unit is selected from a group consisting of a sector, a page, a block, a super-block, and a plurality of blocks of the non-volatile memory.

13. The data storage device of claim 10, further comprising:
a memory translation layer operated by the CPU configured to determine whether the data to be stored in the storage media is compressed data prior to determining whether the size of data to be stored in the storage media satisfies the reference condition.

14. The data storage device of claim 13, wherein when the data to be stored in the storage media is compressed data, the data is stored in the storage media without further data compression.

15. A system comprising:
a plurality of solid state drives, wherein each of the plurality of solid state drives comprises a storage media; and
a controller configured to selectively compress data for storage in the storage media based on whether a size of the data to be stored in the storage media satisfies a reference condition, wherein the controller comprises a memory translation layer configured to determine whether a non-zero remainder is generated upon dividing the size of the data by a physical storage unit and the remainder is less than a reference size, the reference size being less than 50% of the physical storage unit.

16. The system of claim 15, wherein the storage media comprises at least one non-volatile memory, and the physical storage unit is selected from a group consisting of a sector, a page, a block, a super-block, and a plurality of blocks of the non-volatile memory.

17. The system of claim 15, further comprising a server for providing a server function.

* * * * *